US012270087B2

(12) United States Patent
Grigorieva et al.

(10) Patent No.: US 12,270,087 B2
(45) Date of Patent: *Apr. 8, 2025

(54) PRESS HARDENING METHOD

(71) Applicant: ArcelorMittal, Luxembourg (LU)

(72) Inventors: Raisa Grigorieva, Metz (FR); Florin Duminica, Tilff (BE); Brahim Nabi, Leuven (BE); Pascal Drillet, Rozérieulles (FR); Thierry Sturel, Le Ban Saint Martin (FR)

(73) Assignee: ArcelorMittal, Luxembourg (LU)

(*) Notice: Subject to any disclaimer, the term of this patent is extended or adjusted under 35 U.S.C. 154(b) by 410 days.

This patent is subject to a terminal disclaimer.

(21) Appl. No.: 17/771,862

(22) PCT Filed: Oct. 20, 2020

(86) PCT No.: PCT/IB2020/059837
§ 371 (c)(1),
(2) Date: Apr. 26, 2022

(87) PCT Pub. No.: WO2021/084376
PCT Pub. Date: May 6, 2021

(65) Prior Publication Data
US 2022/0396845 A1   Dec. 15, 2022

(30) Foreign Application Priority Data
Oct. 30, 2019  (WO) .................. PCT/IB2019/059285

(51) Int. Cl.
| C21D 7/13 | (2006.01) |
| C21D 8/02 | (2006.01) |
| C23C 2/12 | (2006.01) |
| C23C 2/26 | (2006.01) |
| C23C 2/28 | (2006.01) |
| C23C 14/35 | (2006.01) |

(52) U.S. Cl.
CPC .............. *C21D 7/13* (2013.01); *C21D 8/0205* (2013.01); *C21D 8/0273* (2013.01); *C23C 2/12* (2013.01); *C23C 2/261* (2022.08); *C23C 2/28* (2013.01); *C23C 2/29* (2022.08); *C23C 14/35* (2013.01); *C21D 2211/001* (2013.01); *C21D 2211/002* (2013.01); *C21D 2211/005* (2013.01); *C21D 2211/008* (2013.01); *C21D 2261/00* (2013.01)

(58) Field of Classification Search
CPC ...... C21D 7/13; C21D 8/0205; C21D 8/0273; C21D 2211/001; C21D 2211/002; C21D 2211/005; C21D 2211/008; C21D 2261/00; C21D 1/673; C21D 1/74; C21D 8/005; C21D 8/02; C21D 9/48; C21D 8/04; C21D 1/18; C21D 8/0447; C21D 8/0473; C21D 8/0494; C22C 38/06; C22C 38/08; C22C 38/14; C22C 38/18; C22C 38/02; C22C 38/04; C23C 2/04; C23C 2/06; C23C 2/40; C23C 8/10; C23C 8/80; C23C 30/00; C23C 2/12; C23C 2/29; C23C 2/261; C23C 2/28; B21D 22/022
USPC ......................................................... 148/645
See application file for complete search history.

(56) References Cited

U.S. PATENT DOCUMENTS

| 5,032,469 A | 7/1991 | Merz et al. |
| 6,336,349 B1 | 1/2002 | Hauger et al. |
| 2007/0163685 A1* | 7/2007 | Kusumi .................... C23C 2/26 |
| | | 148/634 |
| 2013/0153094 A1 | 6/2013 | Verloop et al. |
| 2014/0134450 A1 | 5/2014 | Eberlein |
| 2014/0234658 A1 | 8/2014 | Nozaki et al. |
| 2015/0013409 A1 | 1/2015 | Monnoyer et al. |
| 2016/0017452 A1 | 1/2016 | Puerta Velasquez et al. |
| 2016/0022484 A1 | 1/2016 | Yu et al. |
| 2016/0122889 A1 | 5/2016 | Muhr et al. |
| 2016/0237585 A1 | 8/2016 | Eberlein et al. |
| 2016/0304981 A1 | 10/2016 | Song et al. |
| 2017/0029918 A1 | 2/2017 | Panier et al. |
| 2017/0073789 A1 | 3/2017 | Schuhmacher et al. |

(Continued)

FOREIGN PATENT DOCUMENTS

| CA | 3022671 A1 * | 11/2017 | ........... B32B 15/015 |
| CN | 103827335 A | 5/2014 | |

(Continued)

OTHER PUBLICATIONS

Search Report of PCT/IB2020/0059838 dated Aug. 12, 2020.

(Continued)

*Primary Examiner* — Alexandra M Moore
*Assistant Examiner* — Danielle M. Carda
(74) *Attorney, Agent, or Firm* — Davidson Kappel LLC

(57) ABSTRACT press hardening method includes the following steps: A. the provision of a steel sheet for heat-treatment, precoated with a zinc- or aluminum-based pre-coating, B. the deposition of a hydrogen barrier pre-coating over a thickness from 10 to 550 nm, and comprising at least one element chosen from among: nickel, chromium, magnesium, aluminum and yttrium, C. batch annealing of the precoated steel sheet to obtain a pre-alloyed steel sheet, the cooling after the batch annealing being performed at a speed of 29.0° C.h$^{-1}$ or less, D. the cutting of the pre-alloyed steel sheet to obtain blank, E. thermal treatment of the blank to obtain a fully austenitic microstructure in the steel, F. the transfer of the blank into a press tool, G. the hot-forming of the blank to obtain a part, H. the cooling of the part obtained at step G).

14 Claims, No Drawings

(56) References Cited

U.S. PATENT DOCUMENTS

| | | | |
|---|---|---|---|
| 2017/0253941 A1 | 9/2017 | Cobo et al. | |
| 2018/0223386 A1 | 8/2018 | Machado Amorim et al. | |
| 2019/0003029 A1* | 1/2019 | Oh | C22C 38/04 |
| 2020/0101695 A1* | 4/2020 | Oh | B32B 15/18 |
| 2021/0254189 A1 | 8/2021 | An et al. | |

FOREIGN PATENT DOCUMENTS

| | | | | |
|---|---|---|---|---|
| CN | 106164319 A | 11/2016 | | |
| CN | 107849628 A | 3/2018 | | |
| CN | 109821951 A | 5/2019 | | |
| DE | 102013010025 A1 | 12/2014 | | |
| EP | 1074317 | 2/2001 | | |
| EP | 2312005 | 4/2011 | | |
| EP | 2377965 A2 | 10/2011 | | |
| EP | 2778247 | 9/2014 | | |
| EP | 2944706 A1 | 11/2015 | | |
| EP | 2984198 A1 | 2/2016 | | |
| EP | 3056591 A1 | 8/2016 | | |
| EP | 3094756 A1 | 11/2016 | | |
| EP | 3329029 A1 | 6/2018 | | |
| EP | 3396010 A1 | 10/2018 | | |
| EP | 3438316 A1 | 2/2019 | | |
| EP | 3175006 B1 | 3/2019 | | |
| EP | 3 521481 A1 | 8/2019 | | |
| EP | 2893047 B1 | 4/2020 | | |
| KR | 20130099042 | 9/2013 | | |
| KR | 20180131944 A | * 12/2018 | | B21D 22/02 |
| WO | WO2017/187255 | 11/2017 | | |
| WO | WO 2018/158166 A1 | 9/2018 | | |
| WO | WO2020/070545 | 4/2020 | | |
| WO | WO 2021/081377 A1 | 4/2021 | | |
| WO | WO2021/084376 A1 | 5/2021 | | |
| WO | WO 2021/084378 A1 | 5/2021 | | |
| WO | WO 2021/084379 A1 | 5/2021 | | |

OTHER PUBLICATIONS

Written Opinion of PCT/IB2020/059838.
Search Report of PCT/IB2020/059837 dated Sep. 12, 2020.
Written Opinion of PCT/IB2020/059837.
Windmann M et al, "Formation of intermetallic phases in Al-coated hot-stamped 22MnB5 sheets in terms of coating thickness and Si content", Surface and Coatings Technology, (Jul. 1, 2014), vol. 246; pp. 17-25.
Search Report of PCT/IB2020/059842 dated Nov. 26, 2020.
Written Opinion of PCT/IB2020/059842.
Search Report of PCT/IB2020/059841 dated Jan. 1, 2020.
Written Opinion of PCT/IB2020/059841.

* cited by examiner

PRESS HARDENING METHOD

The present invention relates to a press hardening method comprising the provision of a steel sheet coated with a pre-coating for anti-corrosion purpose, being directly topped by a hydrogen barrier pre-coating which better inhibits hydrogen absorption and a part having excellent resistance to delayed fracture. The invention is particularly well suited for the manufacture of automotive vehicles.

Coated steel sheets for press hardening are sometimes termed "pre-coated," this prefix indicating that a transformation of the nature of the pre-coating will take place during heat treatment before stamping. There can be more than one pre-coating. This invention discloses two pre-coatings.

BACKGROUND

It is known that certain applications, especially in the automotive field, require metal structures to be further lightened and strengthened in the event of an impact, and also require good drawability. To this end, steels having improved mechanical properties are usually used, such steel being formed by cold and hot-stamping.

SUMMARY OF THE INVENTION

However, it is known that the sensitivity to delayed fracture increases with the mechanical strength, in particular after certain cold-forming or hot-forming operations since high residual stresses are liable to remain after deformation. In combination with atomic hydrogen possibly present in the Steel sheet, these stresses are liable to result in delayed fracture, that is to say fracture that occurs a certain time after the deformation itself. Hydrogen may progressively build up by diffusion into the crystal lattice defects, such as the matrix/inclusion interfaces, twin boundaries and grain boundaries. It is in the latter defects that hydrogen may become harmful when it reaches a critical concentration after a certain time. This delay results from the residual stress distribution field and from the kinetics of hydrogen diffusion, the hydrogen diffusion coefficient at room temperature being low. In addition, hydrogen localized at the grain boundaries weakens their cohesion and favors the appearance of delayed intergranular cracks.

Some parts are produced by pre-alloying an aluminum based coated steel sheet and then by hot-forming the alloyed precoated steel sheet. Usually, these parts have really bad behavior concerning the hydrogen absorption during the batch annealing and during the hot stamping. Indeed, since the batch annealing is performed for hours, a high amount of hydrogen can be absorbed especially during the batch annealing.

The patent application EP3396010 discloses a method of manufacturing an Al—Fe alloy coated steel sheet for hot forming, the Al—Fe alloy coated steel sheet having high resistance to hydrogen delayed fracture and coating layer separation and high weldability, the method comprising:

forming an Al—Si coating layer on a surface of a base steel sheet, heating the Al—Si coated base steel sheet to a heat treatment maximum temperature ranging from 450° C. to 750° C. at a heating rate of 1° C./hr to 500° C./hr in a heating furnace in which an atmosphere having a dew point of less than −10° C. is present; and forming an Al—Fe alloy coating layer on the surface of the base steel sheet by maintaining the Al—Si coated base steel sheet at the heat treatment maximum temperature for 1 to 100 hours.

The atmosphere of the batch annealing process and the heat treatment conditions are adjusted to obtain a specific microstructure and characteristics of Al—Fe for preventing hydrogen delayed fracture.

Indeed, this patent application discloses an aluminum-iron (Al—Fe) alloy coated steel sheet for hot forming, having high resistance to hydrogen delayed fracture and coating layer separation and high weldability, the Al—Fe alloy coated steel sheet comprising a base steel sheet and an alloy coating layer formed between the base steel sheet and an oxide layer, wherein the alloy coating layer comprises:

an Al—Fe alloy layer I formed on the base steel sheet and having a Vickers hardness of 200 Hv to 800 Hv;

an Al—Fe alloy layer III formed on the Al—Fe alloy layer I and having a Vickers hardness of 700 Hv to 1200 Hv; and an Al—Fe alloy layer II formed in the Al—Fe alloy layer III continuously or discontinuously in a length direction of the steel sheet, and having a Vickers hardness of 400 Hv to 900 Hv, wherein an average oxygen content at a depth of 0.1 μm from a surface of the oxide layer is 20% or less by weight.

However, in practice, the aluminum-iron alloy coated steel sheet having the specific microstructure and characteristics is very difficult to obtain. Indeed, a broad range of dew point and heating speed is disclosed. Thus, there is a risk that the specific Al—Fe alloy coating is not obtained in the whole range resulting in important research efforts to find the right parameters.

It is an object of the present invention to provide an easy-to-implement press hardening method wherein the hydrogen absorption into the pre-alloyed aluminum-based steel sheet and therefore into the press hardened part is prevented. The present invention also additionally or alternatively aims to make available a part having excellent resistance to delayed fracture obtainable by said press-hardening method including hot-forming.

The present invention provides a press hardening method comprising the following steps:

A. the provision of a steel sheet for heat-treatment, precoated with a zinc- or aluminum-based pre-coating for anti-corrosion purpose, B. the deposition of a hydrogen barrier pre-coating over a thickness from 10 to 550 nm, C. the batch annealing of the precoated steel sheet to obtain a pre-alloyed steel sheet, the cooling after the batch annealing being performed at a speed of 29.0° C.h$^{-1}$ or less, D. the cutting of the pre-alloyed steel sheet to obtain blank, E. the thermal treatment of the blank to obtain a fully austenitic microstructure in the steel, F. the transfer of the blank into a press tool, G. the hot-forming of the blank to obtain a part, H. the cooling of the part obtained at step G) in order to obtain a microstructure in steel being martensitic or martensito-bainitic or made of at least 75% in terms of volume fraction of equiaxed ferrite, from 5 to 20% in volume of martensite and of bainite in amount less than or equal to 10% in volume.

DETAILED DESCRIPTION

Indeed, without willing to be bound by any theory, the inventors have surprisingly found that when the steel sheet is precoated with a hydrogen barrier pre-coating and when the cooling after the batch annealing is performed at a speed of 29.0° C.h$^{-1}$ or less, the absorption of hydrogen into the steel sheet is reduced. Indeed, it is believed that thanks to the hydrogen barrier pre-coating, thermodynamically stable oxides are formed on the surface of the hydrogen barrier pre-coating with a low kinetic of hydrogen diffusion. These thermodynamically stable oxides reduce H$_2$ absorption. Moreover, it seems that since the atmosphere is oxidizing, the zinc- or aluminum-based pre-coating for anti-corrosion purpose forms also external oxides leading to a thicker oxides layer on the surface of the precoated steel sheet. Finally, it seems that a slow cooling of the batch annealing allows release of the small amounts of hydrogen that could anyway be absorbed during the batch annealing.

In step A), the steel sheet used is made of steel for heat treatment as described in the European Standard EN 10083. It can have a tensile resistance superior to 500 MPa, advantageously between 500 and 2000 MPa before or after heat-treatment.

The weight composition of steel sheet is preferably as follows: 0.03%≤C≤0.50% 0.3%≤Mn≤3.0% 0.05%≤Si≤0.8% 0.015%—Ti≤0.2% 0.005%≤Al≤0.1% 0%≤Cr≤2.50% 0%≤S≤0.05% 0%≤P≤0.1%; 0%≤B≤0.010%; 0%≤Ni≤2.5% 0%≤Mo≤0.7% 0%≤Nb≤0.15%; 0%—N≤0.015% 0%≤Cu≤0.15% 0%≤Ca≤0.01% 0%≤W≤0.35%, the balance being iron and unavoidable impurities from the manufacture of steel.

For example, the steel sheet is 22MnB5 with the following composition: 0.20%≤C≤0.25%; 0.15%≤Si≤0.35%; 1.10%≤Mn≤1.40%; 0%≤Cr≤0.30%; 0%≤Mo≤0.35%; 0%≤P≤0.025%; 0%≤S≤0.005%; 0.020%≤Ti≤0.060%; 0.020%≤Al≤0.060%; 0.002%≤B≤0.004%, the balance being iron and unavoidable impurities from the manufacture of steel.

The steel sheet can be Usibor®2000 with the following composition: 0.24%≤C≤0.38%; 0.40%≤Mn≤3%; 0.10%≤Si≤0.70%; 0.015%≤Al≤0.070%; 0%≤Cr≤2%; 0.25%≤Ni≤2%; 0.020%≤Ti≤0.10%; 0%≤Nb≤0.060%; 0.0005%≤B≤0.0040%; 0.003%≤N≤0.010%; 0.0001%≤S≤0.005%; 0.0001%≤P≤0.025%; it being understood that the contents of titanium and nitrogen satisfy Ti/N>3.42; and that the contents of carbon, manganese, chromium and silicon satisfy:

$$2{,}6C + \frac{Mn}{5{,}3} + \frac{Cr}{13} + \frac{Si}{15} \geq 1{,}1\%$$

the composition optionally comprising one or more of the following: 0.05%≤Mo≤0.65%; 0.001%≤W≤0.30%; 0.0005%≤Ca≤0.005%, the balance being iron and unavoidable impurities from the manufacture of steel.

For example, the Steel sheet is Ductibor®500 with the following composition: 0.040%≤C≤0.100%; 0.80%≤Mn≤2.00%; 0%≤Si≤0.30%; 0%≤S≤0.005%; 0%≤P≤0.030%; 0.010%≤Al≤0.070%; 0.015%≤Nb≤0.100%; 0.030%≤Ti≤0.080%; 0%≤N≤0.009%; 0%≤Cu≤0.100%; 0%≤Ni≤0.100%; 0%≤Cr≤0.100%; 0%≤Mo≤0.100%; 0%≤Ca≤0.006%, the balance being iron and unavoidable impurities from the manufacture of steel.

Steel sheet can be obtained by hot rolling and optionally cold rolling depending on the desired thickness, which can be for example between 0.7 and 3.0 mm.

Optionally, in step A), the hydrogen barrier pre-coating comprises optional elements chosen from Sr, Sb, Pb, Ti, Ca, Mn, Sn, La, Ce, Cr, Zr or Bi, the content by weight of each additional element being inferior to 0.3% by weight.

Preferably in step A), the hydrogen barrier pre-coating comprises at least one element chosen from among: nickel, chromium, aluminum, magnesium and yttrium.

Preferably in step A), the hydrogen barrier pre-coating consists of nickel and chromium, i.e. the hydrogen barrier pre-coating comprises nickel, chromium and unavoidable impurities. Advantageously, the weight ratio Ni/Cr is between 1.5 and 9. Indeed, without willing to be bound by any theory, it is believed that this specific ratio further decreases the hydrogen absorption during the austenitization treatment.

In another preferred embodiment, the hydrogen barrier pre-coating consists of nickel and aluminum, i.e. the hydrogen barrier pre-coating comprises Ni, Al and unavoidable impurities.

In another preferred embodiment, the hydrogen barrier pre-coating consists of chromium at 50% or 75% or 90% by weight. More preferably it consists of chromium, i.e. the hydrogen barrier pre-coating comprises only Cr and unavoidable impurities.

In another preferred embodiment, the hydrogen barrier pre-coating consists of nickel, aluminum and yttrium, i.e. the hydrogen barrier pre-coating comprises Ni, Al and Y and unavoidable impurities.

In another preferred embodiment, the hydrogen barrier pre-coating consists of magnesium at 50% or 75% or 90% by weight. More preferably it consists of magnesium, i.e. the hydrogen barrier pre-coating comprises only Mg and unavoidable impurities.

Preferably, in step A), the hydrogen barrier pre-coating has a thickness between 10 and 550 nm and more preferably between 10 and 90 or between 150 and 250 nm. For example, the thickness of the hydrogen barrier pre-coating is of 50, 200 or 400 nm.

Without willing to be bound by any theory, it seems that when the hydrogen barrier pre-coating is below 10 nm, there is a risk that hydrogen absorbs into steel because the hydrogen barrier pre-coating does not cover enough the steel sheet. When the hydrogen barrier pre-coating is above 550 nm, it seems that there is a risk that the hydrogen barrier pre-coating becomes more brittle and that the hydrogen absorption begins due to the hydrogen barrier pre-coating brittleness.

In a preferred embodiment, the zinc- or aluminum-based pre-coating for anti-corrosion purpose is based on aluminum and comprises less than 15% Si, less than 5.0% Fe, optionally 0.1 to 8.0% Mg and optionally 0.1 to 30.0% Zn, the remainder being Al. For example, the zinc- or aluminum-based pre-coating is AluSi®.

In another preferred embodiment, the zinc- or aluminum-based pre-coating for anti-corrosion purpose is based on zinc and comprises less than 6.0% Al, less than 6.0% of Mg, the remainder being Zn. For example, the zinc- or aluminum-based pre-coating is a zinc coating so to obtain the following product: Usibor® GI.

The zinc- or aluminum-based pre-coating for anti-corrosion purpose can also comprise impurities and residual elements such iron with a content up to 5.0%, preferably 3.0%, by weight.

Preferably, the pre-coatings of step A) are deposited by physical vapor deposition, by electro-galvanization, hot-dip galvanization or roll-coating. Preferably, the hydrogen barrier pre-coating is deposited by electron beam induced deposition or roll coating. Preferably, the zinc- or aluminum-based pre-coating is deposited by hot-dip galvanization.

Optionally, after the deposition of the pre-coatings, a skin-pass can be realized and allows work hardening the coated steel sheet and giving it a roughness facilitating the subsequent shaping. A degreasing and a surface treatment can be applied in order to improve for example adhesive bonding or corrosion resistance.

Preferably, in step C), the batch annealing is performed at a temperature between 450 and 750° C., preferably between 550 and 750° C.

Preferably, in step C), the atmosphere of the batch annealing is air or inert.

Advantageously, in step C), the heating rate of the batch annealing is above or equal to 5000° $C.h^{-1}$, more preferably between 10000 and 15000° $C.h^{-1}$ or between 20000 and 35000° $C.h^{-1}$.

In step C), the cooling speed is below or equal to 29.0° $C.h^{-1}$, more preferably below or equal to 27° $C.h^{-1}$ and advantageously between 15 and 27° $C.h^{-1}$. Indeed, without willing to be bound by any theory, it is believed that above 29.0° $C.h^{-1}$, the cooling is not enough slow to let the hydrogen be released.

Preferably, in step C), the batch annealing is performed during 1 to 100 hours.

After, the pre-alloyed steel sheet is cut to obtain a blank.

A thermal treatment is applied to the blank in a furnace. Preferably, in steps C) and/or E), the atmosphere is inert or has an oxidizing power equal or higher than that of an atmosphere consisting of 1% by volume of oxygen and equal or smaller than that of an atmosphere consisting of 50% by volume of oxygen. The atmosphere may in particular be made of $N_2$ or Ar or mixtures of nitrogen or argon and gas oxidants such as, for example, oxygen, mixtures of CO and $CO_2$ or mixtures of $H_2$ and $H_2O$. It is also possible to use mixtures of CO and $CO_2$ or mixtures of $H_2$ and $H_2$ without addition of inert gas.

Preferably, in steps C) and/or E), the atmosphere has an oxidizing power equal or higher than that of an atmosphere consisting of 10% by volume of oxygen and equal or smaller than that of an atmosphere consisting of 30% by volume of oxygen. For example, the atmosphere is air, i.e. consisting of about 78% of $N_2$, about 21% of $O_2$ and other gas such as rare gases, carbon dioxide and methane.

Preferably, in steps C) and/or E), the dew point is between −30 and +30° C., more preferably −20 and +20° C. and advantageously between −15° C. and +15° C. Indeed, without willing to be bound by any theory, it is believed that when the dew point is in the above range, the layer of thermodynamically stable oxides reduce even more the $H_2$ absorption during the thermal treatment.

Preferably, the thermal treatment is performed at a temperature between 800 and 970° C. More preferably, the thermal treatment is performed at an austenitization temperature Tm usually between 840 and 950° C., preferably 880 to 930° C. Advantageously, said blank is maintained during a dwell time tm between 1 to 12 minutes, preferably between 3 to 9 minutes. During the thermal treatment before the hot-forming, the pre-coatings forms an alloy layer having a high resistance to corrosion, abrasion, wear and fatigue.

At ambient temperature, the mechanism of absorption of hydrogen into steel is different from high temperature, in particular the austenitization treatment. Indeed, usually at high temperature, the water in the furnace dissociates at the surface of the steel sheet into hydrogen and oxygen. Without willing to be bound by any theory, it is believed that the hydrogen barrier pre-coating and the slow cooling after the batch annealing can prevent water dissociation at the hydrogen barrier pre-coating surface. This can prevent the hydrogen diffusion through the coating and can allow the hydrogen anyway adsorbed to be released.

After the thermal treatment, the blank is then transferred to a hot-forming tool and hot-formed at a temperature between 600 and 830° C. The hot-forming can be the hot-stamping or the roll-forming. Preferably, the blank is hot-stamped. The part is then cooled in the hot-forming tool or after the transfer to a specific cooling tool.

The cooling rate is controlled depending on the steel composition, in such a way that the final microstructure after the hot-forming comprises mostly martensite, preferably contains martensite, or martensite and bainite, or is made of at least 75% of equiaxed ferrite, from 5 to 20% of martensite and bainite in amount less than or equal to 10%.

A hardened part having excellent resistance to delayed fracture according to the invention is thus obtained by hot forming. Preferably, the part comprises a steel sheet having a variable thickness coated with a hydrogen barrier pre-coating and an oxide layer comprising thermodynamically stable oxides, such hydrogen barrier pre-coating being alloyed through diffusion with the steel sheet.

More preferably, the part comprises the steel sheet having a variable thickness directly topped by a zinc- or aluminum-based pre-coating, this coating layer being directly topped by the hydrogen barrier pre-coating and an oxide layer comprising thermodynamically stable oxides, such hydrogen barrier pre-coating being alloyed through diffusion with the zinc- or aluminum-based pre-coating, this pre-coating being alloyed with the steel sheet.

Indeed, without willing to be bound by any theory, it seems that iron from steel diffuses to the surface of the barrier pre-coating during the thermal treatment.

Preferably, the thermodynamically stable oxides can comprise respectively $Cr_2O_3$; FeO; NiO; $Fe_2O_3$, $Fe_3O_4$, MgO, $Y_2O_3$, or a mixture thereof.

If a pre-coating based on zinc is present, the oxides can also comprise ZnO. If a pre-coating based on aluminum is present, the oxides can also comprise $Al_2O_3$ and/or $MgAl_2O_4$.

Preferably, the thickness of the oxide layer is between 10 and 550 nm.

Preferably, the part is a front rail, a seat cross member, a side sill member, a dash panel cross member, a front floor reinforcement, a rear floor cross member, a rear rail, a B-pillar, a door ring or a shotgun.

For automotive application, after a phosphating step, the part is dipped in an e-coating bath. Usually, the thickness of the phosphate layer is between 1 and 2 μm and the thickness of the e-coating layer is between 15 and 25 μm, preferably inferior or equal to 20 μm. The cataphoresis layer ensures an additional protection against corrosion. After the e-coating step, other paint layers can be deposited, for example, a primer coat of paint, a basecoat layer and a top coat layer.

Before applying the e-coating on the part, the part is previously degreased and phosphated so as to ensure the adhesion of the cataphoresis layer.

The invention will now be explained in trials carried out for information only. They are not limiting.

EXAMPLES

For all samples, steel sheets used are 22MnB5. The composition of the steel is as follows: C=0.2252% Mn=1.1735% P=0.0126%, S=0.0009% N=0.0037% Si=0.2534% Cu=0.0187% Ni=0.0197% Cr=0.180%

Sn=0.004% Al=0.0371% Nb=0.008% Ti=0.0382% B=0.0028% Mo=0.0017% As=0.0023% et V=0.0284%.

All the steel sheets are coated with a 1$^{st}$ pre-coating having an anti-corrosion purpose called hereinafter "AluSi®". This pre-coating comprises 9% by weight of Silicon, 3% by weight of iron, the balance being aluminum. It is deposited by hot-dip galvanization.

Then, two Trials were coated with a 2$^{nd}$ pre-coating comprising 80% of Ni and 20% of Cr deposited by magnetron sputtering.

Example 1

Hydrogen Test

This test is used to determine the quantity of hydrogen absorbed during the austenitization thermal treatment of a press hardening method.

Trial 1 is a steel sheet coated with a 1$^{st}$ pre-coating being AluSi® (25 μm). Then, a batch annealing at a temperature of 650° C. was performed during 5 hours. The heating rate was of 10800° C.h$^{-1}$. The atmosphere of the batch annealing was air. The cooling after the batch annealing was performed at a speed of 3600° C.h$^{-1}$.

Trial 2 is a steel sheet coated with a 1$^{st}$ pre-coating being AluSi® (25 μm) and a 2$^{nd}$ pre-coating comprising 80% of Ni and 20% of Cr. Then, a batch annealing at a temperature of 650° C. was performed during 5 hours. The heating rate was of 10800° C.h$^{-1}$. The atmosphere of the batch annealing was air. The cooling after the batch annealing was performed at a speed of 3600° C.h$^{-1}$.

Trial 3 is a steel sheet coated with a 1$^{st}$ pre-coating being AluSi® (25 μm). Then, a batch annealing at a temperature of 650° C. was performed during 5 hours. The heating rate was of 10800° C.h$^{-1}$. The atmosphere of the batch annealing was air. The cooling after the batch annealing was performed at a speed of 25° C.h$^{-1}$.

Trial 4 is a steel sheet coated with a 1$^{st}$ pre-coating being AluSi® (25 μm) and a 2$^{nd}$ pre-coating comprising 80% of Ni and 20% of Cr. Then, a batch annealing at a temperature of 650° C. was performed during 5 hours. The heating rate was of 10800° C.h$^{-1}$. The atmosphere of the batch annealing was air. The cooling after the batch annealing was performed at a speed of 25° C.h$^{-1}$.

After, all Trials were cut and heated at a temperature of 900° C. during a dwell time of 3 minutes. The atmosphere during the thermal treatment was air. Blanks were transferred into a press tool and hot-stamped in order to obtain parts having a variable thickness. Then, parts were cooled by dipping trials into warm water to obtain a hardening by martensitic transformation.

Finally, the hydrogen amount absorbed by the trials during the heat treatment was measured by thermic desorption using a TDA or Thermal Desorption Analyser. To this end, each trial was placed in a quartz room and heated slowly in an infra-red furnace under a nitrogen flow. The released mixture hydrogen/nitrogen was picked up by a leak detector and the hydrogen concentration was measured by a mass spectrometer. Results are shown in the following Table 1:

| Trials | 2$^{nd}$ pre-coating | Cooling speed (° C.·h$^{-1}$) | Ratio Ni/Cr | Thickness 2$^{nd}$ pre-coating (nm) | H$_2$ amount (ppm by mass) |
|---|---|---|---|---|---|
| 1 | — | 3600 | — | 200 | 1.15 |
| 2 | Ni/Cr 80/20 | 3600 | 4 | — | 0.75 |
| 3 | — | 25 | — | 200 | 0.9 |
| 4* | Ni/Cr 80/20 | 25 | 4 | — | 0.35 |

*examples according to the invention.

Trial 4 according to the present invention release a significantly low amount of hydrogen compared to comparative examples.

What is claimed is:

1. A press hardening method comprising the following steps:
   A. providing a steel sheet for heat-treatment, precoated with a zinc- or aluminum-based pre-coating;
   B. depositing a hydrogen barrier pre-coating with a thickness from 10 to 550 nm;
   C. batch annealing the precoated steel sheet to obtain a pre-alloyed steel sheet, wherein a heating rate of the batch annealing is above or equal to 5000° C.h$^{-1}$, cooling after the batch annealing being performed at a speed of 29.0° C.h$^{-1}$ or less;
   D. cutting the pre-alloyed steel sheet to obtain a blank;
   E. thermally treating the blank to obtain a fully austenitic microstructure in the steel sheet;
   F. transferring the blank into a press tool;
   G. hot-forming the blank to obtain a part;
   H. cooling the part obtained in step G) in order to obtain a microstructure in the steel sheet, the microstructure being martensitic or being martensitic-bainitic or being made of at least 75% in terms of volume fraction of equiaxed ferrite, from 5 to 20% in volume of martensite and of bainite in an amount less than or equal to 10% in volume.

2. The press hardening method as recited in claim 1 wherein in step B), the hydrogen barrier pre-coating comprises at least one element chosen from the group consisting of: nickel, chromium, magnesium, aluminum and yttrium.

3. The press hardening method as recited in claim 1 wherein in step B), the hydrogen barrier pre-coating consists of nickel and chromium; or nickel and aluminum; or chromium; or nickel and aluminum and yttrium; or magnesium.

4. The press hardening method as recited in claim 1 wherein in step A), the zinc- or aluminum-based pre-coating is based on zinc and comprises less than 6.0% Al and less than 6.0% of Mg, a remainder being Zn.

5. The press hardening method as recited in claim 1 wherein in step A), the zinc- or aluminum-based pre-coating is based on aluminum and comprises less than 15% Si and less than 5.0% Fe, optionally 0.1 to 8.0% Mg and optionally 0.1 to 30.0% Zn, a remainder being Al.

6. The press hardening method as recited in claim 1 wherein in step C), the batch annealing is performed at a temperature between 450° and 750° C.

7. The press hardening method as recited in claim 1 wherein in step C), the batch annealing is performed in an atmosphere that is air or inert.

8. The press hardening method as recited in claim 1 wherein in step C), the cooling speed is below or equal to 27° C.h$^{-1}$.

9. The press hardening method as recited in claim 1 wherein in step C), the batch annealing is performed for 1 to 100 hours.

10. The press hardening method as recited in claim 1 wherein, in steps C and E) independently from each other, the steps are performed in an atmosphere that is inert or has an oxidizing power equal or higher than that of an atmosphere consisting of 1% by volume of oxygen and equal or smaller than that of an atmosphere consisting of 50% by volume of oxygen.

11. The press hardening method as recited in claim 1 wherein step E) is performed in an atmosphere that has a dew point between −30 and +30° C.

12. The press hardening method as recited in claim 1 wherein in step E), the thermal treatment is performed at a temperature between 800 and 970° C.

13. The press hardening method as recited in claim 1 wherein in step E), the thermal treatment is performed for a dwell time between 1 to 12 minutes.

14. The press hardening method as recited in claim 1 wherein during step H), the hot-forming of the blank is at a temperature between 600 and 830° C.

* * * * *